United States Patent [19]

Martin et al.

[11] Patent Number: 5,500,823
[45] Date of Patent: Mar. 19, 1996

[54] MEMORY DEFECT DETECTION ARRANGEMENT

[75] Inventors: Alan Martin, Plymouth; Richard Albon, Tavistock, both of United Kingdom

[73] Assignee: Plessey Semiconductors Limited, United Kingdom

[21] Appl. No.: 221,074

[22] Filed: Mar. 31, 1994

[30] Foreign Application Priority Data

Apr. 14, 1993 [GB] United Kingdom .................. 9307648

[51] Int. Cl.⁶ .................................................. G11C 29/00
[52] U.S. Cl. .................................................. 365/201; 365/190
[58] Field of Search .................................. 365/201, 154, 365/190, 226, 189.09, 189.07, 189.11; 371/21.1

[56] References Cited

U.S. PATENT DOCUMENTS 5,079,744  1/1992  Tobita et al. ............................ 365/201
5,255,230  10/1993 Chan et al. ............................. 365/201

Primary Examiner—A. Zarabian
Attorney, Agent, or Firm—Kirschstein, et al.

[57] ABSTRACT

In a static random access memory made up of six-transistor memory cells arranged in rows and columns, an arrangement for detecting open circuit or "soft" defects in the individual inverters of a memory cell includes lowering the supply voltage of a cell under test to overcome the clamping effect of a feedback inverter, applying input signal voltage changes to one of the bit lines associated with the cell, and testing for the expected voltage changes on the other bit line associated with the cell.

4 Claims, 1 Drawing Sheet

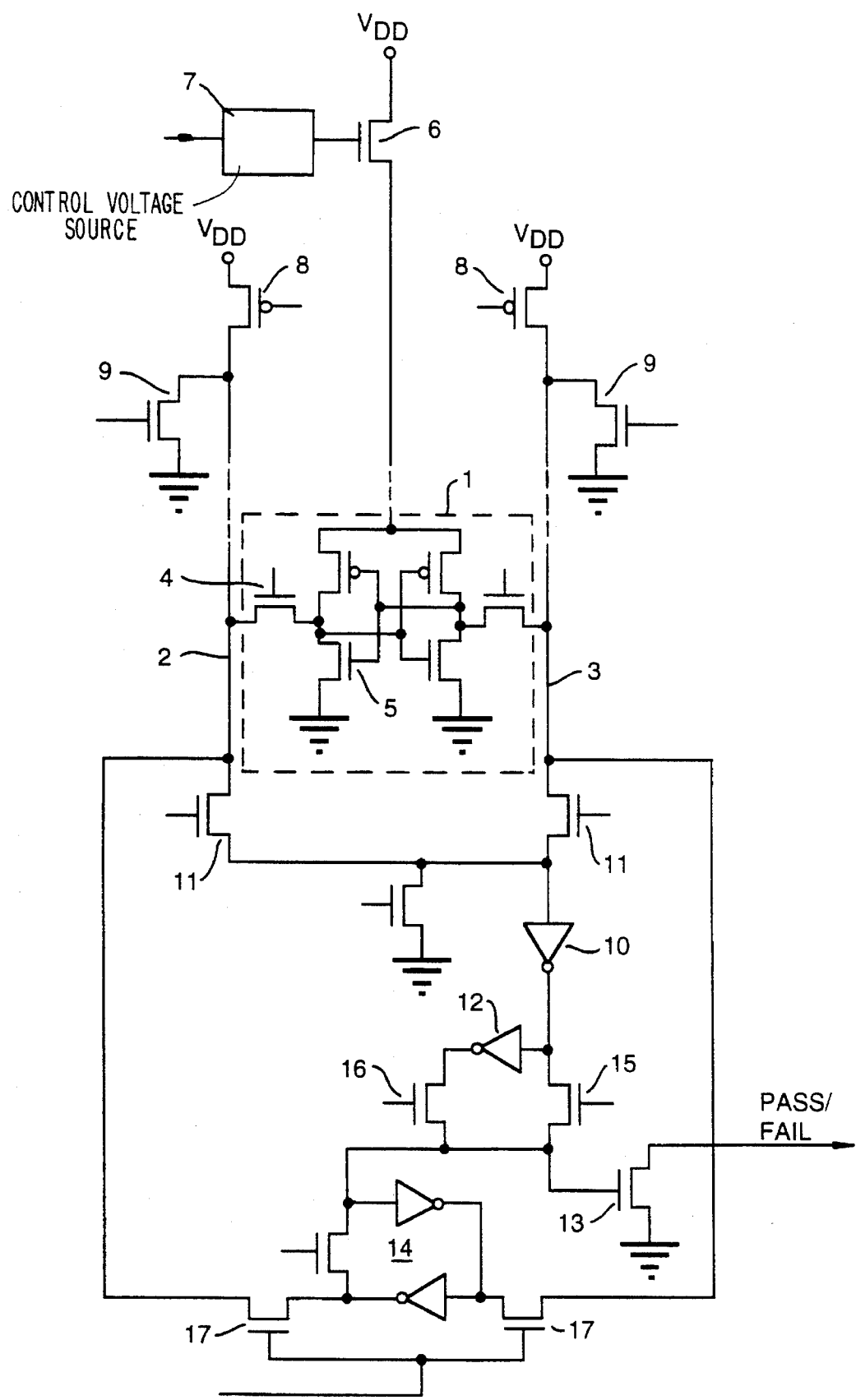

MEMORY DEFECT DETECTION ARRANGEMENT

BACKGROUND OF THE INVENTION

1. Field of the Invention

The present invention is concerned with an arrangement for detecting defects in static random access memories, and in particular although not exclusively with an arrangement for detecting open circuit or "soft" defects in six-transistor memory cells.

2. Description of the Related Art

In large memories over half the area of a chip may be taken up by the array of memory cells, and in order to allow for the occurrence of defects a number of spare circuits or memory cells may be provided on the chip so that during testing any failed circuit or block of memory cells may be replaced by a spare, for example by blowing fuse links, in order to minimize the number of chips rejected.

With advances in technology it is now possible to integrate large amounts of memory into complex systems on single chips, and the costs involved in producing such a system depend increasingly on the defect levels in the embedded memory, and its area and test requirements can be the dominant factors. The use of the comprehensive test and redundancy techniques employed for standard memory chips makes little sense in embedded applications, since the cost of these techniques is justified only by high volume production and little variation in product. The wider the range of designs using external testing and fuse techniques, to more time and effort is required to characterize and implement specific schemes for each variant.

Self testing of memories is now employed in embedded systems to reduce test cost. However, one of the major problems is testing for retention failure and open circuits, which still require tests to be done externally.

SUMMARY OF THE INVENTION

According to the present invention in a semiconductor integrated circuit incorporating a static random access memory comprising an array of rows and columns of memory cells an open circuit or soft defect detection arrangement comprises, in respect of a column of memory cells of the array, means to lower the supply voltage to the cells of said column of memory cells, means to apply a sequence of test signal levels to the bit lines of said column of memory cells, and means to indicate an open circuit defect in one or more of the cells of said column from the response to said test signal levels.

Preferably said means to indicate an open circuit defect in one or more cells of said column comprises a latch circuit the outputs of which are connectable to said bit lines of said column whereby said column exhibiting said defect may be identified. The supply voltage to said column of cells may be switched to a predetermined reduced value for the period of the application of said test signal levels to said bit lines.

BRIEF DESCRIPTION OF THE DRAWING

An arrangement for detecting open circuit or soft defects in a static random access memory will now be described by way of example with reference to the accompanying drawing, which shows part of the arrangement schematically.

DETAILED DESCRIPTION OF THE PREFERRED EMBODIMENT

Referring to the drawing, the arrangement tests each of the six-transistor memory cells 1 of a column of cells in an array as two separate inverters, by testing each independently with high ($V_{DD}$) and low (earth) inputs, the presence of a defect being detected either by a cell not switching or switching more slowly than a good cell.

Under normal operating conditions it is not possible to test either of the two inverters separately, because of the parasitic inverter that forms the feedback latch of the inverter under test. This parasitic inverter can prevent a high on the respective bit line 2 or 3 from reaching the switching point of the inverter under test through the n-channel access transistor 4 due to the clamping effect of the n-channel driver transistor 5 of the parasitic inverter. This clamping effect can be overcome by reducing the conductance of this driver transistor 5 compared to that of the access transistor 4, by reducing the supply voltage to the memory cells 1 of the array during testing.

There is a value for the supply voltage of the memory cells 1 above which a high level on a bit line 2 or 3 will not switch an inverter on, and similarly there is a value for that supply voltage below which a low level on a bit line 2 or 3 will not switch an inverter off. For the period of testing, therefore, the supply voltage to the memory cells 1 is reduced from $V_{DD}$ to a predetermined fraction of $V_{DD}$ by a series n-channel device 6 under the control of a circuit 7.

The inverters within a memory cell 1 are connected to the bit lines 2 and 3 by respective access transistors such as 4, and during a test it is necessary to switch these access transistors on. In order to detect correct switching it is necessary to precharge the output bit line (2 or 3) to the opposite state to that expected. It is also necessary to apply both high ($V_{DD}$) and low (earth) signal levels to the input bit line (3 or 2), this being accomplished by one p-channel transistor 8 and one n-channel transistor 9 per bit line.

The bit lines 2 and 3 are selectively connected to the input of an inverting amplifier 10 by way of n-channel devices 11, the output of this amplifier in turn being connected to the input of a second inverting amplifier 12. An output from one or other of these amplifiers 10 and 12 is then applied, after an adequate time to allow the memory cell 1 to switch correctly, to an open source n-channel output transistor 13 and to a latch circuit 14 by way of respective n-channel transistors 15 and 16, depending on whether a low to high or a high to low test is taking place.

The value stored in the latch circuit 14 may be applied to the bit lines 2 and 3 for sensing with a normal sensing amplifier by switching into conduction the n-channel devices 17, to identify the column location of a faulty cell 1.

In order to reduce peak current consumption within the memory array and so reduce the capacity of the voltage generator for the array the tests are performed on alternate columns i.e. as one column is testing for a high to low transition of an inverter within a cell, the next is testing for a low to high.

The arrangement can be disabled in order to reduce the current consumption of the circuit when not in use, by switching all precharging devices 8 and 9 off as well as the bit line selection transistors 11. A disable transistor is also introduced to apply a valid (low) input for the sense amplifier (not shown) when not in use.

A soft defect test arrangement is required for every column within the array since any multiplexing of bit lines will invalidate the test. This means that arrays must be tested one row at a time. For a typical array of 64 rows and operating with $V_{DD}$ of 5 Volts the switching time of a cell is approximately 250 ns. Four tests are required per row, thus the total time to test the array becomes 64 μs. This switching time is however increased for lower values of $V_{DD}$ to approximately 4 μs, producing a total test time of approximately 1 ms.

We claim:

1. In a semiconductor integrated circuit static random access memory including a plurality of memory cells arranged in rows and columns, each memory cell comprising respective first and second inverters, and respective first and second bit lines associated with each column of said memory cells, a testing arrangement for defects in individual said inverters comprising: means for applying to each of the memory cells of a column a supply voltage selectively of a first or normal operating supply voltage value and a second or test supply voltage value lower than said first value; means selectively for applying a sequence of test signal voltages to said first bit line associated with the column of memory cells; detector circuit means; and means operatively connected to said detector circuit means, and operative for selectively connecting said second bit line associated with said column of memory cells to apply to said detector circuit means any change in signal voltage on said second bit line in response to said sequence of test signal voltages.

2. A testing arrangement in accordance with claim 1, and further comprising means selectively for precharging said second bit line to a signal voltage different to that expected in response to said sequence of test signal voltages.

3. A testing arrangement in accordance with claim 1, wherein said first and second inverters of the memory cell have inputs which are arranged to be connected by way of respective access transistor devices to respective ones of said first and second bit lines associated with the memory cell, and further comprising means selectively for forward biasing said access transistor devices while said sequence of test signal voltages is applied to said respective one of said first and second bit lines.

4. A testing arrangement in accordance with claim 1, wherein said detector circuit means comprises a latch circuit having outputs, and further comprising means selectively for connecting said outputs of said latch circuit to said first and second bit lines, whereby the column of said memory cells in which a defect is detected is identified by means of readout circuits of said memory.

* * * * *